US010663529B1

(12) United States Patent
Bolotski et al.

(10) Patent No.: US 10,663,529 B1
(45) Date of Patent: May 26, 2020

(54) AUTOMATIC BATTERY CHARGING

(71) Applicant: Amazon Technologies, Inc., Seattle, WA (US)

(72) Inventors: Michael Bolotski, Seattle, WA (US); Daniel Buchmueller, Seattle, WA (US); Nathan Stuart Friendly, Seattle, WA (US); Fabian Hensel, Seattle, WA (US); Walker Chamberlain Robb, Seattle, WA (US); Joshua White Traube, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 909 days.

(21) Appl. No.: 14/866,253

(22) Filed: Sep. 25, 2015

(51) Int. Cl.
*B64C 39/02* (2006.01)
*G01C 21/34* (2006.01)
*H04L 12/26* (2006.01)
*H04W 24/06* (2009.01)
*G01R 31/392* (2019.01)
*H02J 7/00* (2006.01)
*G01R 31/36* (2020.01)
*G01R 31/378* (2019.01)

(52) U.S. Cl.
CPC ....... *G01R 31/392* (2019.01); *G01R 31/3648* (2013.01); *G01R 31/378* (2019.01); *H02J 7/007* (2013.01); *H02J 7/00043* (2020.01); *H02J 7/0047* (2013.01); *H04L 43/50* (2013.01); *H04W 24/06* (2013.01)

(58) Field of Classification Search
CPC ............ G01R 31/3679; G01R 31/3648; G01R 31/3665; H02J 7/0009; H02J 7/0047; H02J 7/007

USPC .......................................................... 702/63
See application file for complete search history.

(56) References Cited

U.S. PATENT DOCUMENTS

| | | | | |
|---|---|---|---|---|
| 6,031,354 A | * | 2/2000 | Wiley ................ | G01R 31/3648 320/116 |
| 7,072,871 B1 | * | 7/2006 | Tinnemeyer ....... | G01R 31/3651 320/132 |
| 2001/0000212 A1 | * | 4/2001 | Reipur ............... | G01R 31/3613 320/104 |
| 2005/0035743 A1 | * | 2/2005 | Kawakami ......... | G01R 31/3662 320/162 |
| 2006/0181245 A1 | * | 8/2006 | Mizuno .............. | G01R 31/3624 320/132 |
| 2006/0276980 A1 | * | 12/2006 | Mizuno ................ | G01R 31/361 702/63 |
| 2008/0054845 A1 | * | 3/2008 | Wang ................... | H02J 7/0042 320/111 |

(Continued)

*Primary Examiner* — Ly D Pham
(74) *Attorney, Agent, or Firm* — Lee & Hayes, P.C.

(57) ABSTRACT

An illustrative battery charging device may identify a battery to be charged, and charge the identified battery using charge settings that are optimized for the identified battery. In some embodiments, the battery charging device may determine the optimized settings based on monitoring charging performance and discharge activities of the battery over time. The battery charging device may exchange data with a battery management service device, such as by exchanging battery health information, battery settings, and/or other data. The battery charging device may determine charge setting and times to charge a battery that is intended to power an unmanned aerial vehicle to complete a flight path.

20 Claims, 7 Drawing Sheets

(56) References Cited

U.S. PATENT DOCUMENTS

| | | | | |
|---|---|---|---|---|
| 2010/0327809 A1* | 12/2010 | Takaoka | H01M 10/441 | 320/118 |
| 2011/0078092 A1* | 3/2011 | Kim | B60L 11/1824 | 705/412 |
| 2011/0127944 A1* | 6/2011 | Saito | B60L 11/1824 | 320/101 |
| 2011/0245987 A1* | 10/2011 | Pratt | H01M 10/44 | 700/295 |
| 2012/0212183 A1* | 8/2012 | Yamada | H02J 3/32 | 320/126 |
| 2012/0306450 A1* | 12/2012 | Nakayama | G06F 1/263 | 320/134 |
| 2014/0177145 A1* | 6/2014 | Kawahara | H01M 10/441 | 361/679.01 |
| 2014/0184169 A1* | 7/2014 | Tsuru | B60L 3/0046 | 320/136 |
| 2014/0266061 A1* | 9/2014 | Wachal | H02J 7/0068 | 320/134 |
| 2014/0375275 A1* | 12/2014 | Hung | B60L 3/003 | 320/139 |
| 2015/0069975 A1* | 3/2015 | Farah | H02J 7/0019 | 320/150 |
| 2015/0070024 A1* | 3/2015 | Kim | G01R 31/3679 | 324/430 |
| 2015/0097530 A1* | 4/2015 | Scarlatti | B60L 11/1827 | 320/109 |
| 2015/0158392 A1* | 6/2015 | Zhao | B60L 11/1861 | 320/109 |
| 2015/0239365 A1* | 8/2015 | Hyde | B60L 11/1861 | 701/2 |
| 2015/0303768 A1* | 10/2015 | Henderson | B60L 13/04 | 310/90.5 |
| 2016/0204490 A1* | 7/2016 | Scott | H01M 2/40 | 429/405 |
| 2016/0232736 A1* | 8/2016 | Holtappels | H01M 10/4257 | |
| 2016/0285289 A1* | 9/2016 | Arends | H02J 7/0054 | |
| 2016/0327613 A1* | 11/2016 | Tenmyo | G01R 31/3662 | |
| 2016/0359339 A1* | 12/2016 | Hwang | H02J 7/0047 | |
| 2017/0057650 A1* | 3/2017 | Walter-Robinson | B64D 41/00 | |
| 2017/0149101 A1* | 5/2017 | Sakabe | H01M 10/48 | |
| 2017/0222437 A1* | 8/2017 | Pratt | H02J 1/00 | |

* cited by examiner

BATTERY MANAGEMENT
SERVICE DEVICES 102

500

```
DETERMINE AN UPCOMING FLIGHT PATH FROM AN ORIGIN LOCATION TO A
DESTINATION LOCATION, THE FLIGHT PATH BEING ASSIGNED TO THE UAV
502
```

```
DETERMINE AN OPTIMAL CHARGE LEVEL FOR THE RECHARGEABLE BATTERY
BASED AT LEAST IN PART ON THE FLIGHT PATH AND A UAV PREDICTION MODEL
504
```

```
ASSIGN THE RECHARGEABLE BATTERY TO POWER THE UAV TO COMPLETE THE
FLIGHT PATH
506
```

```
DETERMINE, USING THE IDENTIFIER, A CHARGING TIME, A CHARGING CURRENT,
AND A CHARGING VOLTAGE FOR THE RECHARGEABLE BATTERY BASED AT LEAST
IN PART ON THE BATTERY CHARGING SETTINGS
508
```

```
SEND, VIA THE COMMUNICATION INTERFACE, THE OPTIMAL CHARGE LEVEL, THE
CHARGING TIME, THE CHARGING CURRENT, AND THE CHARGING VOLTAGE TO A
BATTERY CHARGING DEVICE COUPLED TO THE RECHARGEABLE BATTERY
510
```

Fig. 5

AUTOMATIC BATTERY CHARGING

BACKGROUND

Many battery-operated devices employ rechargeable batteries to provide electrical energy. In order to recharge a rechargeable battery, certain charge settings should be used based on attributes of the battery. In some cases, use of sub-optimal charging techniques or settings may inefficiently charge the rechargeable battery and/or may cause irreparable damage to the rechargeable battery. Improper charging settings may significantly reduce the capacity of a rechargeable battery, may increase the likelihood of failure of the battery, and/or may cause other undesirable outcomes.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features.

FIG. 5 illustrates is an example flow diagram of a process for automatically charging a battery according to some implementations.

DETAILED DESCRIPTION

Figure 1:
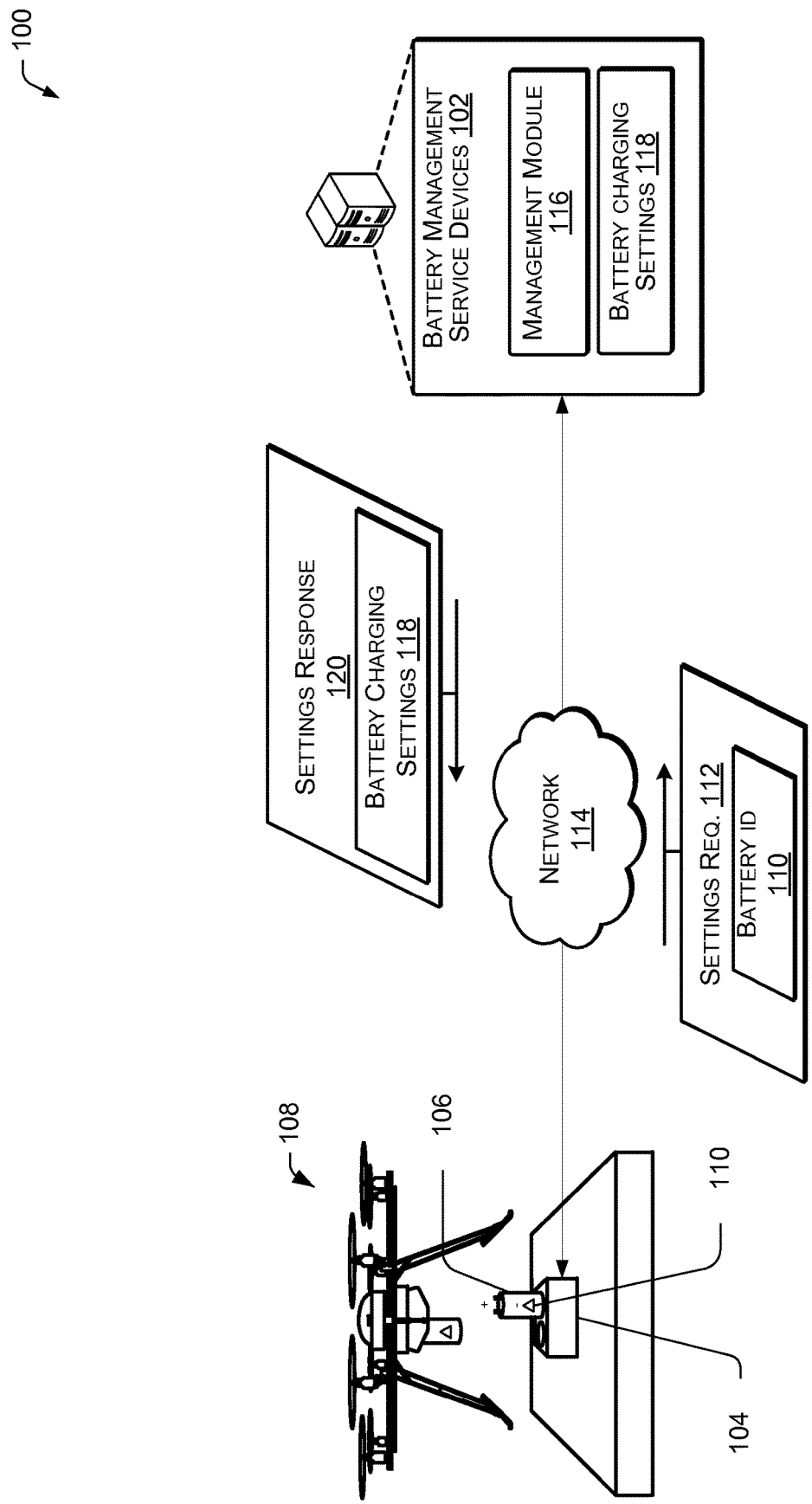
FIG. 1 illustrates an example framework for a battery management service that provides battery charging settings to battery charging devices, according to some implementations.

Some implementations described herein include techniques and arrangements for performing automatic battery charging by a battery management service. The present disclosure describes an electronic device that may be operated to receive optimal battery charging settings from a battery management service, and charge a rechargeable battery according to the battery charging settings. In some embodiments, the electronic device may communicate sufficient information (e.g., battery identifier information) that may be processed by the battery management service to determine a battery type associated with the battery. Upon determining the battery type associated with the battery, the battery management service may determine battery charging settings for recharging the battery. Further, the battery management service may send the battery charging settings to the battery charging device. Once the battery charging device receives the battery charging settings, the battery charging device may charge the battery in accordance with the battery charging settings. As a result, the use of subop- timal battery charging settings may be avoided, thereby preventing damage to a battery and/or other undesirable outcomes. In some embodiments, the battery charging settings may include a charging rate, a charging current, charging temperature, maximum charging time, a charging voltage, maximum battery voltage, and/or minimum battery voltage. In multi-cell batteries, the battery charging settings may further include a balance dead band (i.e., the permitted difference between individual cell voltages), balance current limit (i.e., a permitted difference in current flowing into individual cells), balance start voltage (i.e., defining the voltage at which to activate a cell balancing mechanism), maximum cell voltage, and/or minimum cell voltage.

In some examples, the battery charging device may send a charging log to the battery management service. The charging log may describe one or more battery charging settings used to charge a rechargeable battery. For instance, the charging log may confirm that the battery charging device used the battery charging settings received from the battery management service to charge the battery. Further, the charging log may describe one or more metrics associated with the charging of the battery. For instance, the charging log may include an identifier of the battery, an initial state of charge level of the battery, a final state of charge level of the battery, one or more temperature values detected during the charging of the battery, a total amount of the charging time, an amount of current input into the battery, and/or other relevant metrics.

In some examples, the battery charging device may send a battery health report to the battery management service. The health report may describe one or more attributes of a rechargeable battery. For instance, the health report may include the internal resistance and/or capacity of the rechargeable battery, a current duty cycle, and a predicted life duty cycle. In addition, the health report may include the charge acceptance of a rechargeable battery. In some embodiments, the health report may additionally include information for individual cells of a battery. For instance, the health report may indicate a charge acceptance, internal resistance, voltage, and/or self-discharge of individual cells of a battery. Furthermore, the battery management service may use the health report to update the battery charging settings. For example, the battery management service may use testing techniques to determine battery charge settings that prolong battery life and/or maximize battery performance based on the health reports of one or more battery charging devices, which may systematically test batteries to obtain results that indicate best charge settings.

In some cases, the battery management service may determine a probability of failure of a battery. For instance, the battery management service may generate a prediction model for predicting a failure of a battery and/or a threshold degradation of a battery's charge capacity based at least in part on charging logs associated with the battery and/or one or more health reports associated with the battery. Further, the battery management service may update the prediction model as additional battery charging logs and/or battery health reports are received from battery charging devices.

In some examples, the battery management service may assign a battery for use to power an unmanned aerial vehicle (UAV). For instance, the battery management service may identify a battery compatible with the UAV. Further, the battery management service may determine battery charging settings corresponding to a type of the battery. In addition, the battery management service may determine a charge level needed for the battery to power the UAV for a flight path. As used herein, a charge level may include an amount of energy stored on a rechargeable battery. In some cases, the charge level may include an amount of energy required to power a UAV to complete the flight path in addition to having a reserve capacity (or safety factor). Upon determining the battery charging settings and the charge level, the battery management service may send the battery charging settings and the charge level to a battery charging device.

Further, the battery management service may generate a UAV prediction model for individual UAVs. Additionally, the battery management service may determine an amount of battery energy a UAV would require to perform an activity based at least in part on the UAV prediction model. For example, the battery management service may determine a charge level required to complete a flight path based at least in the UAV prediction model. The factors of the UAV prediction model may correspond to a type of a UAV, one or more dimensions of a UAV, sensor information captured during previous flights by a UAV, environmental information (e.g., weather), delivery package characteristics (e.g., size, weight, etc), battery performance (e.g., historical performance of a battery and/or a battery type in flight), and/or flight characteristics. In some examples, the battery management service may receive a performance log from a UAV. Further, the battery management service may update a UAV prediction model associated with the UAV based at least in part on information included in the performance log.

In some embodiments, the battery management service may determine a battery type best suited for a particular application. For example, a plurality of battery types may be used to power a UAV during a testing phase. Further, the battery management service may utilize testing techniques to determine one or more battery types of the plurality of battery types best suited for use with the UAV. In addition, the battery management service may utilize testing techniques to determine optimal battery charging settings for the one or more battery types.

For discussion purposes, some examples are described in the environment of a battery management service. However, the implementations herein are not limited to the particular examples provided, and may be extended to other types of environments, other types of electronic devices, and so forth, as will be apparent to those of skill in the art in light of the disclosure herein.

FIG. 1 illustrates an example framework for a battery management service that provides battery charging settings to battery charging devices, according to some implementations.

FIG. 1 shows illustrative interactions between a battery management service device 102, and a battery charging device 104, when performing various operations, including preparing a rechargeable battery 106 to be used by a UAV 108. As described herein, UAVs comprise a variety of vehicles, from conventional fixed wing airplanes, to helicopters, to ornithopters (i.e., machines that fly like birds), and are used in a variety of roles, such as to delivery packages to customers. They can be remotely piloted by a pilot or by a central controller or can be autonomous or semi-autonomous vehicles that fly missions using preprogrammed coordinates, global positioning system (GPS) navigation, etc. Some examples of rechargeable batteries include lead acid, nickel cadmium (NiCd), nickel metal hydride (NiMH), lithium ion (Li-ion), and lithium ion polymer (Li-ion polymer), etc. Further, although FIG. 1 illustrates the rechargeable battery 106 being used to power the UAV 108, the rechargeable battery 106 may be used to store and supply electricity in various applications.

Referring to FIG. 1, suppose that the battery 106 has been discharged. The battery 106 may be connected to and/or placed proximate to the battery charging device 104. Further, the battery charging device 104 may determine a battery identifier 110 of the battery 108. This may be performed manually (e.g., by an operator using a hand-held scanner/sensor), via an automated scanning/reading process using fixed scanners/readers, or by a combination of manual and automatic scanning/reading. In some embodiments, placement of the battery proximate to the battery charging device 104 may initiate scanning/reading of the battery identifier 110.

The term battery identifier 110 refers to an identifier associated with individual batteries used with the battery management system 100. Typically, but not necessarily, each battery 108 is tagged or otherwise marked with the battery identifier 110. For example, battery 108 may be marked or tagged with a bar code, 2D/3D bar code, Quick Response (QR) code, Near Field Communication (NFC) tag, Radio Frequency Identifier Device (RFID) tag, magnetic stripe, Universal Product Code (UPC), Stock-Keeping Unit (SKU) code, serial number, a unique physical shape/feature that identifies the battery, and/or other designators/features (including proprietary designations) that may be used as a battery identifier 110 to facilitate battery management system operations. Additionally, or alternatively, the battery charging device 104 may use visual recognition or optical character recognition (OCR) to determine the identifier 110 of the battery 108.

Further, the battery charging device 104 may send a battery charging settings request 112 to the battery management service 102 over a network 114. As illustrated in FIG. 1, the settings request 112 may include the battery identifier 110. In some cases, the network 114 may be a publicly accessible network of linked networks, possibly operated by various distinct parties, such as the Internet. In other embodiments, the network 114 may include a private network, personal area network ("PAN"), LAN, WAN, cable network, satellite network, etc. or some combination thereof, each with access to and/or from the Internet. For example, the battery management service 102 may be located within a single data center and may communicate via a private network.

As illustrated in FIG. 1, the battery management service 102 may include a management module 116. Upon receipt of the setting request 112, the management module 116 may determine battery charging settings 118 associated with the battery identifier 110. Further, the management module 116 may send a battery charging settings response 120 to the battery charging device 104. As illustrated in FIG. 1, the settings response 120 may include the battery charging settings 118.

Some examples of battery charging settings 118 may include a charging current, charging duration, and/or charging voltage value for charging the type of rechargeable battery. The battery charging settings 118 described herein may be created and/or maintained by the battery management service 102 using any suitable types of data structures, and using any suitable data storage or database techniques.

Upon receipt of the settings response 120, the battery charging device 104 may use the battery charging settings 118 to charge the battery 106. For instance, the battery charge settings 118 may instruct the battery charging device 104 to charge the battery with a current of 1.5 Amps and a voltage of 12 volts. As a result, the battery charging device 104 may provide a 1.5 Ah-12v output to charge the battery 106.

Figure 2:
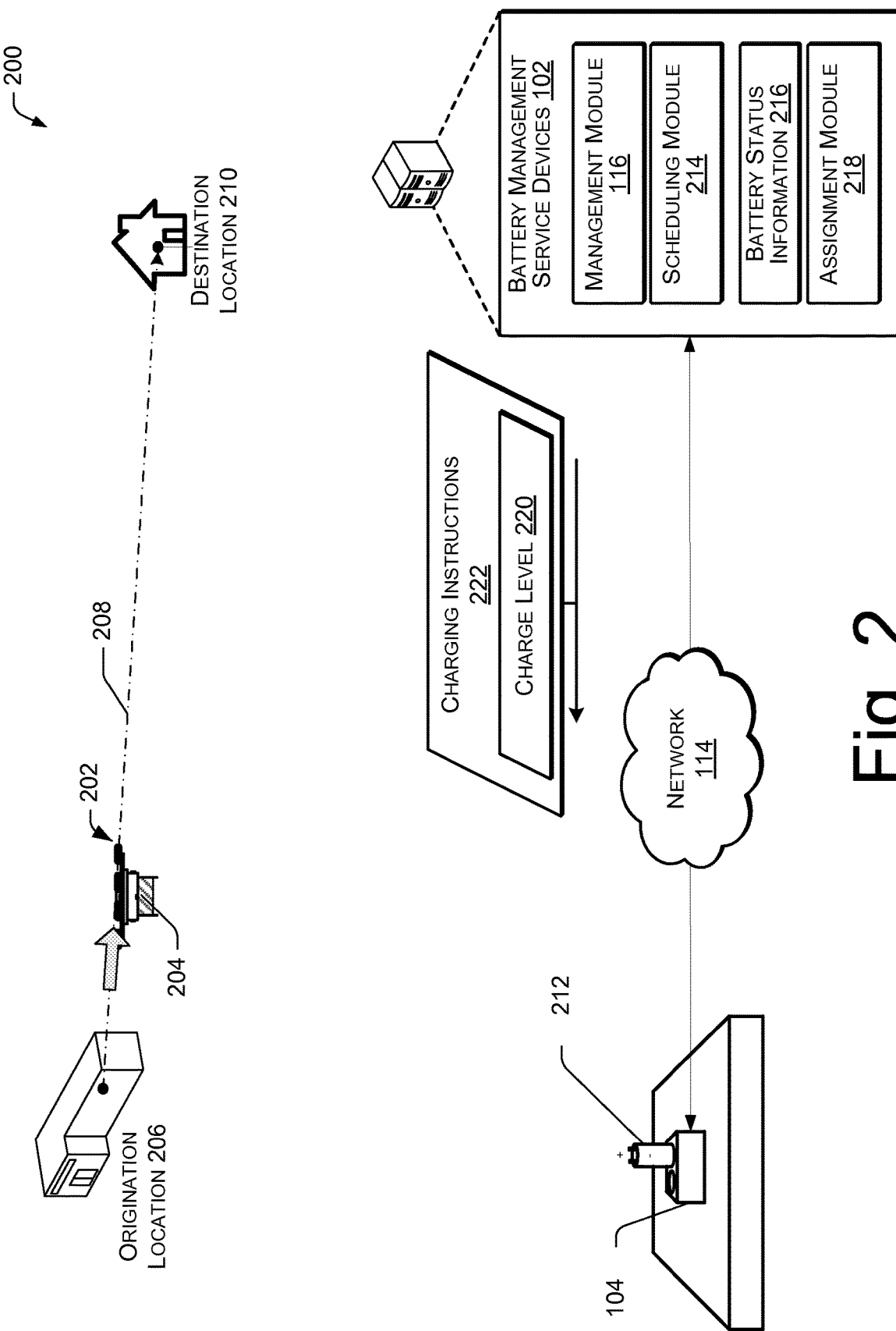
FIG. 2 illustrates an example environment for a battery management service that performs unmanned aerial vehicle (UAV) battery management, according to some implementations.

FIG. 2 illustrates an example environment for a battery management service that that performs UAV battery management, according to some implementations. The environment 200 may correspond to a delivery area where UAVs deliver inventory items to various destination locations. For instance, a UAV 202 may be scheduled to deliver a package 204 to a destination in the environment 200. As an example, the UAV 202 may be scheduled to begin its delivery mission from an origination location 206, such as a fulfillment center where inventory is stored, and may fly along a flight path 208 to a destination location 210. Although FIG. 2 illustrates a single destination location 210, in some embodiments the flight path 208 may include multiple destination locations 210, and/or a return trip.

Further, FIG. 2 shows illustrative interactions between the battery management service device 102 and the battery charging device 104, when performing various operations, including preparing a rechargeable battery 212 to be used by the UAV 202 during its flight on the flight path 208.

As illustrated in FIG. 2, the battery management service 102 may include a scheduling module 214, battery status information 216, the management module 116, and an assignment module 218. The scheduling module 214 may receive orders and schedule deliveries by a UAV to a destination location. For instance, the scheduling module 214 may assign delivery of the delivery package 204 to a UAV. Further, the scheduling module 214 may determine the flight path 208 between the origination location 206 and the destination location 210. In some cases, the scheduling module 214 may determine the flight path 208 based at least in part on one or more anticipated flight characteristics and/or historical flight characteristics. Some examples of flight characteristics may include one or more dimensions (e.g., size, weight, etc.) of the delivery package 204, flight altitude, flight speed, UAV sensor activity, environmental factors (e.g., weather), and/or other flight activity in the delivery area. The scheduling module 214 may also determine the flight path 208 based at least in part on flight path restrictions and/or noise restrictions.

The management module 116 may determine an expected electric load for the UAV to complete the flight path 208. For instance, the management module 116 may determine an amount of battery energy the UAV would require to complete the flight path based at least in part on the distance of the flight path, an expected delivery date of the delivery package 204, anticipated flight characteristics, historical flight characteristics, environmental conditions, and/or one or more dimensions of the UAV. Further, the management module 116 may determine a charge level 220 for the flight path based at least in part on the electric load and a reserve capacity. In some examples, the reserve capacity may equal a pre-defined percentage of the electric load (e.g., 10% of the electric load). In some other examples, the reserve capacity may equal an electric load needed to travel for a predetermined period time (e.g., an electric load needed to travel an additional forty-five minutes).

The battery status information 216 may include information for one or more rechargeable batteries, such as battery 106 and battery 212. For instance, for individual batteries, the battery status information 216 may store an estimated capacity, an estimated state of charge, a terminal voltage, internal resistance, expected cycle life, estimated number of charge cycles, and/or an estimated likelihood of battery failure. Further, for individual batteries, the battery status information may identify a type of the individual battery, one or more dimensions (e.g., size, weight, etc.) of the individual battery, and/or one or more preferred uses for the individual battery (e.g., preferred UAV types, compatible environmental conditions, flight duration, etc.). Further, the battery status information 216 described herein may be created and maintained using any suitable types of data structures, and using any suitable data storage or database techniques.

The assignment module 218 may assign a battery to a UAV for performing a flight. For instance, the assignment module 218 may assign the battery 212 to the UAV 202. In some cases, the assignment module 218 may assign the battery 212 to the UAV 202 based at least in part on the battery status information 216 and the charge level 220. For example, the assignment module 218 may determine that the battery 212 is compatible with the UAV 202. Further, the assignment module 218 may determine that battery 212 has a capacity greater than charge level 220. Lastly, the management module 116 may send battery charging instructions 222 including the charge level 220 to the battery charging device 104 via the network 114. In some cases, the charging instructions 222 may further include battery charging settings, such as the battery charging settings 118, for the battery 212.

In some instances, the management module 116 may determine a charging rate 222 for charging the battery 212. For example, the scheduling module 214 may determine a departure and/or arrival time for the UAV 202. Further, the management module 116 may determine the appropriate charging rate with respect to the departure and/or arrival time. As an example, the management module 116 may determine that the battery 212 should be charged at the fastest available charging rate in order to have the battery 212 prepared for flight within a predetermined time period (e.g., thirty minutes).

Upon receipt of the charging instructions 222, the battery charging device 104 may charge the battery 212 to the charge level 220 by performing a charging process. Once the state of charge of the battery 212 is within a predetermined threshold of the charge level 220, the battery charging device 104 may end the charging process. Further, the battery 212 will be prepared to power the UAV as the UAV 202 flies along the flight path 208.

Figure 3:
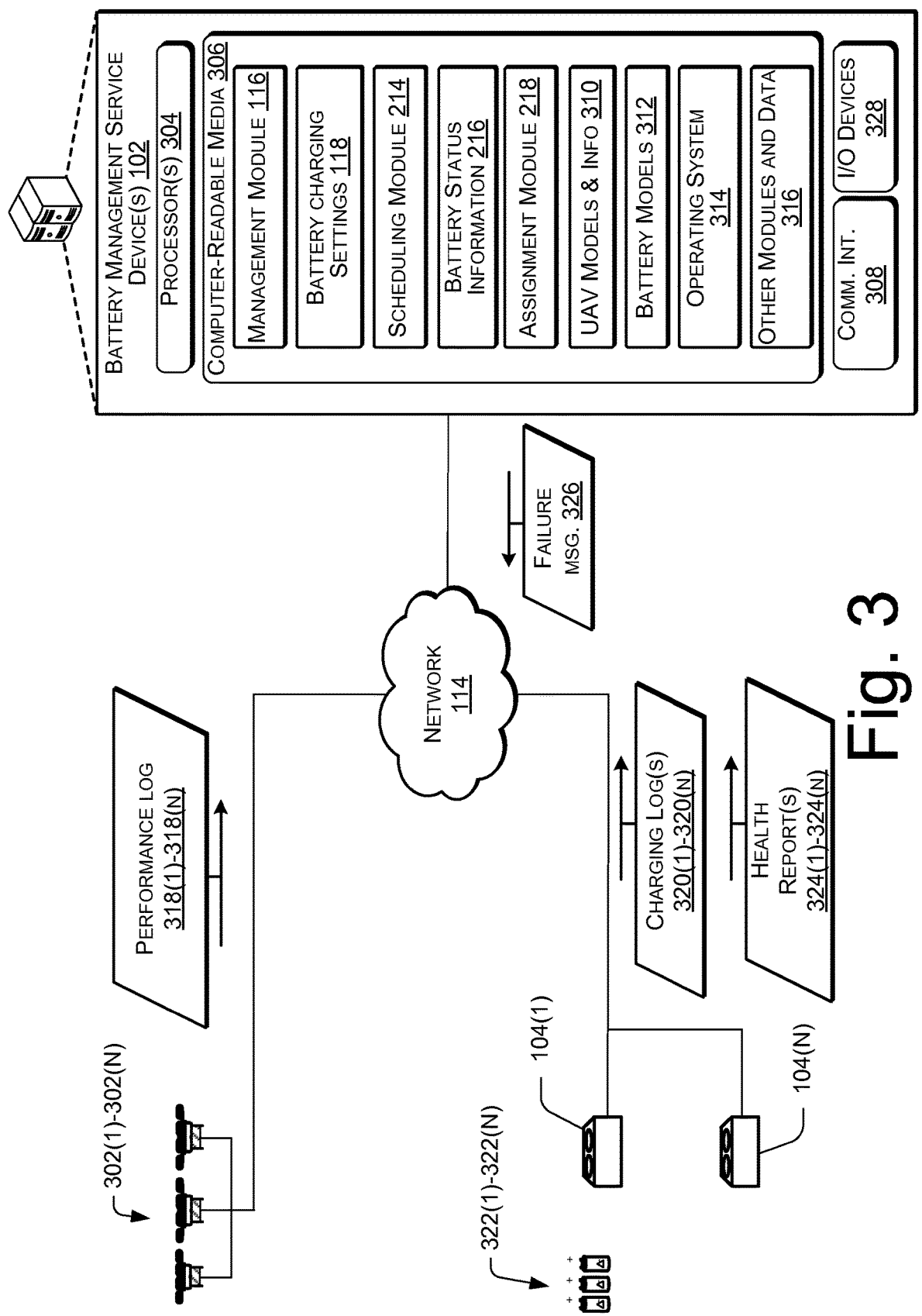
FIG. 3 illustrates an example environment for a battery management service that determines optimal battery charging settings, according to some implementations.

FIG. 3 illustrates an example environment for a battery management service that determines optimal battery charging settings, according to some implementations. FIG. 3 shows illustrative interactions between a battery management service device(s) 102, one or more battery charging devices 104(1)-104(N), and one or more UAVs 302(1)-302(N), when performing various operations, including managing a plurality of rechargeable batteries.

The battery management service 102 may include one or more servers or other types of computing devices that may be embodied in any number of ways. For instance, in the case of a server, the modules, other functional components, and data may be implemented on a single server, a cluster of servers, a server farm or data center, a cloud-hosted computing service, a cloud-hosted storage service, and so forth, although other computer architectures may additionally or alternatively be used.

Further, while the figures illustrate the components and data of the battery management service 102 as being present in a single location, these components and data may alternatively be distributed across different computing devices and different locations in any manner. Consequently, the functions may be implemented by one or more service computing devices, with the various functionality described above distributed in various ways across the different computing devices. Multiple battery management services 102 may be located together or separately, and organized, for example, as virtual servers, server banks, and/or server farms. The described functionality may be provided by the servers of a single entity or enterprise, or may be provided by the servers and/or services of multiple different entities or enterprises.

In the illustrated example, each battery management service 102 may include one or more processors 304, one or more computer-readable media 306, and one or more communication interfaces 308. Each processor 304 may be a single processing unit or a number of processing units, and may include single or multiple computing units or multiple processing cores. The processor(s) 304 can be implemented as one or more microprocessors, microcomputers, microcontrollers, digital signal processors, central processing units, state machines, logic circuitries, and/or any devices that manipulate signals based on operational instructions. For instance, the processor(s) 304 may be one or more hardware processors and/or logic circuits of any suitable type specifically programmed or configured to execute the algorithms and processes described herein. The processor(s) 304 can be configured to fetch and execute computer-readable instructions stored in the computer-readable media 306, which can program the processor(s) 304 to perform the functions described herein.

The computer-readable media 306 may include volatile and nonvolatile memory and/or removable and non-removable media implemented in any type of technology for storage of information, such as computer-readable instructions, data structures, program modules, or other data. Such computer-readable media 306 may include, but is not limited to, RAM, ROM, EEPROM, flash memory or other memory technology, optical storage, solid state storage, magnetic tape, magnetic disk storage, RAID storage systems, storage arrays, network attached storage, storage area networks, cloud storage, or any other medium that can be used to store the desired information and that can be accessed by a computing device. Depending on the configuration of the battery management service 102, the computer-readable media 306 may be a type of computer-readable storage media and/or may be a tangible non-transitory media to the extent that when mentioned, non-transitory computer-readable media exclude media such as energy, carrier signals, electromagnetic waves, and signals per se.

The computer-readable media 306 may be used to store any number of functional components that are executable by the processors 304. In many implementations, these functional components comprise instructions or programs that are executable by the processors 304 and that, when executed, specifically configure the one or more processors 304 to perform the actions attributed herein to the battery management service 102. In addition, the computer-readable media 306 may store data used for performing the operations described herein.

In the illustrated example, the functional components stored in the computer-readable media 306 may include the management module 116, scheduling module 214, and assignment module 218. Further, the computer-readable media 306 may store the battery charging settings 118, the battery status information 216, UAV models and information 310, and battery prediction models 312. Additional functional components stored in the computer-readable media 306 may include an operating system 314 for controlling and managing various functions of the battery management service 102. The battery management service 102 may also include or maintain other functional components and data, such as other modules and data 316, which may include programs, drivers, etc., and the data used or generated by the functional components. Further, the battery management service 102 may include many other logical, programmatic, and physical components, of which those described above are merely examples that are related to the discussion herein.

The communication interface(s) 308 may include one or more interfaces and hardware components for enabling communication with various other devices, such as the battery management service 102, the battery charging devices 104(1)-104(N), the UAVs 302(1)-302(N), or other computing devices, over the network(s) 114. For example, communication interface(s) 308 may facilitate communication through one or more of the Internet, cable networks, cellular networks, wireless networks (e.g., Wi-Fi, cellular) and wired networks. As several examples, the battery management service 102 and the battery charging devices 104(1)-104(N) may communicate and interact using any combination of suitable communication and networking protocols, such as Internet protocol (IP), transmission control protocol (TCP), hypertext transfer protocol (HTTP), cellular or radio communication protocols, and so forth.

As illustrated in FIG. 3, the UAVs 302(1)-302(N) may send performance logs 318(1)-318(N) to the battery management service 102 over the network 114. Each performance log 318 may include performance data for one or more flights performed by a UAV 302. For example, a first performance log 318(1) may include analytics associated with a flight path completed by the UAV 302(1). Further, other performance logs 318(2)-318(N) may be associated with other UAVs 302(2)-302(N). In some cases, the performance logs 318 may include UAV identification information, an actual load discharged by one or more batteries of the UAV during activity of the UAV, sensor information, environmental information (e.g., weather), delivery package characteristics (e.g., size, weight, etc), battery performance, and/or flight characteristics.

As illustrated in FIG. 2, the battery management service 102 may include the UAV models 310. Further, the management module 116 may predict an amount of battery energy a UAV 302 would require to complete a flight path based at least in part on the UAV models 310. For instance, the UAV model 310 may include a prediction model that determines an expected load to power the UAV 302(1) on a flight path, such as flight path 208 (not shown in FIG. 3).

In some examples, the UAV models 310 may employ testing techniques to predict an amount of battery energy a UAV 302 would require to complete a flight path. For instance, the UAV model 310 may include a rule based decision system that determines an expected load to power the UAV 302(1) on a flight path. In some other instances, the UAV model 310 may include trained statistical models. Further, the UAV models 310 may account for factors such as UAV type, UAV dimensions, sensor information captured during previous flights, environmental information (e.g., weather), delivery package characteristics (e.g., size, weight, etc.), battery performance, and/or flight characteristics, time of day, day of the week, etc. Further, the UAV models 310 may be periodically updated and re-trained based on the performance logs 318 to keep the UAV models 310 up to date.

As illustrated in FIG. 3, the battery charging devices 104(1)-104(N) may send charging logs 320(1)-320(N) to the battery management service 102 over the network 114. Each charging log 318 may include one or more battery charging settings used to charge a battery 322 during a charging process. For example, a first charging log 320(1) may include the battery charging settings, such as battery charging settings 118, used to charge the battery 322(1). Further, other charging logs 320(2)-320(N) may be associated with other batteries 322(2)-322(N). In some instances, the battery log 320 may include an identifier of the corresponding battery 322, an initial state of charge level of the corresponding battery 322, a final state of charge level of the corresponding battery 322, one or more temperature values detected during the charging of the corresponding battery 322, a total amount of the charging time, an amount of current input into the corresponding battery 322, the voltage of the input into the corresponding battery, and/or other relevant information.

As illustrated in FIG. 3, the battery charging devices 104(1)-104(N) may send health reports 324(1)-324(N) to the battery management service 102. In addition, the management module 116 may store the information of the health reports 234(1)-324(N) to the battery status information 218. Each health report 324 may include one or more battery health attributes of a battery 322. For example, a first health report 324(1) may include the internal capacitance of the battery 322(1). Further, other health reports 324(2)-324(N) may be associated with other batteries 322(2)-322(N).

In some examples, the health report 324(1) may include the internal resistance and the capacity of the battery 322(1). In addition, the health report 324(1) may include the battery's 322(1) charge acceptance (i.e., ability to accept a charge from the battery charging device 104(1)). Further, the health report 324 may include information for individual cells of the battery 322(1). For instance, the health report 324(1) may indicate a charge acceptance, internal resistance, and/or self-discharge of individual cells of the battery 322(1).

In some embodiments, the management module 116 may update the battery charging settings 118 based at least in part on the charging logs 320 and/or the health reports 324. For example, the battery management service 102 may employ testing techniques to determine battery charge settings 118 that prolong battery life and/or maximize battery performance based at least in part on the charging logs 320 and the health reports 324. As an example, the management module 116 may monitor health reports 324 for a plurality of batteries 322 associated with a particular type of battery. Further, the management module 116 may identify one or more batteries of the plurality of batteries with a health attribute above or below a predetermined threshold. In addition, the management module 116 may determine whether the charging logs 320 identify charging settings and/or charging activity potentially responsible for the respective health attribute being above or below the predetermined threshold. Lastly, the management module 116 may update the charging settings 116 associated with the plurality of batteries based at least in part on the identified charging settings and/or charging activity.

In some other embodiments, the management module 116 may use the performance logs 318 and/or the health reports 320 to identify one or more types of batteries 324 to use for a specific application. For instance, the management module 116 may determine that a particular type of battery is best suited for use with a type of the UAV 302(1) based at least in part on comparing performance logs 318 associated with the type of UAV 302(1), and determining that the type of the battery 322(1) correlates to favorable performance by UAVs 302 having the type of the UAV 302(1) in comparison to other types of batteries 322(2)-322(N). Additionally, or alternatively, the management module 116 may determine that a particular type of battery is best suited for use with a type of the UAV 302(1) based at least in part on comparing health reports 324 associated with the type of the battery 322(1), and determining that the type of the UAV 302(1) correlates favorably to the health of batteries 322 having the type of the battery 322(1).

Further, the management module 116 may predict future performance of a battery 322 based at least in part on the battery models 312. For instance, the battery models 312 may include a prediction model that determines a probability of failure of a battery. In some examples, the battery models 312 may employ testing techniques to predict future performance of the rechargeable battery.

For example, the battery model 312 may include a rule based decision system that determines a probability of failure of the battery 322. In some other examples, the UAV model 310 may include trained statistical models. Further, the battery models 312 may account for factors such as battery type, battery performance, one or more temperature values detected during the charging of the battery, a total amount of current input into the battery, an estimated capacity, internal resistance, cycle life, the amount of total cycles, charge acceptance, and/or self-discharge of individual cells of the battery 322. Further, the battery models 312 may be periodically updated and re-trained based on the health reports 324 to keep the battery models 312 up to date. Additionally, or alternatively, the battery models 312 may be periodically updated and re-trained based on the performance logs 318 to keep the battery models 312 up to date.

In some cases, the management module 116 may determine that the probability of a battery failing is above a predefined threshold based at least in part on the battery models 312. As a result, the management module 116 may update the battery status information 216 to indicate that the battery should not be used. Further, the management module 116 may send a failure message 326 to a battery charging device 104 associated with the battery communicating that that the probability of a battery failing is above a predefined threshold.

The battery management service 102 may further be equipped with various input/output (I/O) devices 328. Such I/O devices 328 may include a display, various user interface controls (e.g., buttons, joystick, keyboard, mouse, touch screen, etc.), audio speakers, connection ports and so forth.

Figure 4:
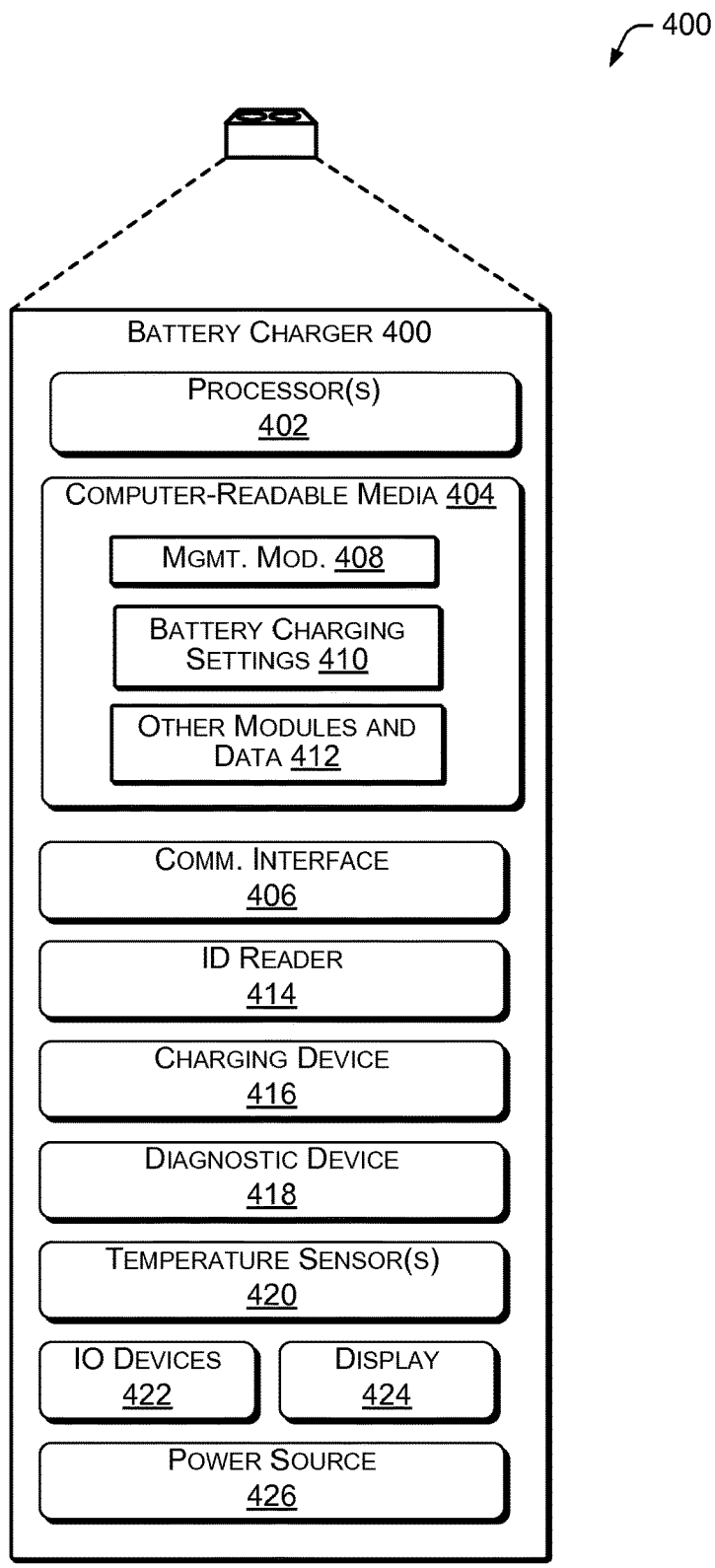
FIG. 4 illustrates an example battery charging device according to some implementations.

FIG. 4 illustrates select components of a battery charging device, such as the battery charging device 104, which are generally designated as 400.

In the illustrated example, the battery charging device 400 may include one or more processors 402, one or more computer-readable media 404, and one or more communication interfaces 406. Each processor 402 may be a single processing unit or a number of processing units, and may include single or multiple computing units or multiple processing cores. The processor(s) 402 can be implemented as one or more microprocessors, microcomputers, microcontrollers, digital signal processors, central processing units, state machines, logic circuitries, and/or any devices that manipulate signals based on operational instructions. For instance, the processor(s) 402 may be one or more hardware processors and/or logic circuits of any suitable type specifically programmed or configured to execute the algorithms and processes described herein. The processor(s) 402 can be configured to fetch and execute computer-readable instructions stored in the computer-readable media 404, which can program the processor(s) 402 to perform the functions described herein.

The computer-readable media 404 may include volatile and nonvolatile memory and/or removable and non-removable media implemented in any type of technology for storage of information, such as computer-readable instructions, data structures, program modules, or other data. Such computer-readable media 404 may include, but is not limited to, RAM, ROM, EEPROM, flash memory or other memory technology, optical storage, solid state storage, magnetic tape, magnetic disk storage, RAID storage systems, storage arrays, network attached storage, storage area networks, cloud storage, or any other medium that can be used to store the desired information and that can be accessed by a computing device. Depending on the configuration of the battery charging device 400, the computer-readable media 404 may be a type of computer-readable storage media and/or may be a tangible non-transitory media to the extent that when mentioned, non-transitory computer-readable media exclude media such as energy, carrier signals, electromagnetic waves, and signals per se.

The computer-readable media 404 may be used to store any number of functional components that are executable by the processors 402. In many implementations, these functional components comprise instructions or programs that are executable by the processors 402 and that, when executed, specifically configure the one or more processors 402 to perform the actions attributed above to the battery charging device 400. In addition, the computer-readable media 404 may store data used for performing the operations described herein.

In the illustrated example, the functional components stored in the computer-readable media 404 may include a management module 408. Further, the computer-readable media 404 may store battery charging settings 410, such as battery charging settings 118.

The battery charging device 400 may also include or maintain other functional components and data, such as other modules and data 412, which may include programs, drivers, etc., and the data used or generated by the functional components. Further, the battery charging device 400 may include many other logical, programmatic, and physical components, of which those described above are merely examples that are related to the discussion herein.

The communication interface(s) 406 may include one or more interfaces and hardware components for enabling communication with various other devices, such as battery management service 102, over the network(s) 114. For example, communication interface(s) 406 may facilitate communication through one or more of the Internet, cable networks, cellular networks, wireless networks (e.g., Wi-Fi, cellular) and wired networks. As several examples, the battery charging device 400 and the battery management service 102 may communicate and interact with one another using any combination of suitable communication and networking protocols, such as Internet protocol (IP), transmission control protocol (TCP), hypertext transfer protocol (HTTP), cellular or radio communication protocols, and so forth.

As illustrated in FIG. 4, the battery charging device 400 may include an identification reader 414. In some embodiments, the identification reader 414 may include scanners and/or readers for determining an identifier of a battery. For instance, the identification reader 414 may scan a bar code, 2D/3D bar code, Quick Response (QR) code, Near Field Communication (NFC) tag, Radio Frequency Identifier Device (RFID) tag, magnetic stripe, Universal Product Code (UPC), Stock-Keeping Unit (SKU) code, serial number, etc. In some other embodiments, the identification reader 414 may include visual recognition devices for determining an identifier of a battery. In some instances, a visual recognition device may identify a battery based at least in part on the dimensions and/or visual attributes of the battery. In yet another embodiment, the identification reader 414 may include an optical character recognition (OCR) device that may determine an identifier of the battery based at least in part on identifying text on associated with the battery.

As illustrated in FIG. 4, the battery charging device 400 may include a charging device 416. The charging device 416 may be used to charge a battery coupled to the battery charging device 400 according to the battery charging settings 410. For instance, the charging device 416 may charge the battery via a wired connection. In some other instances, the charging device 416 may be utilize wireless charging technology to charge the battery. In addition, the battery charging device 416 may be capable of performing various charging methods according to various charging patterns. Further, the charging device 416 may employ forms of voltage regulation to control the charging voltage applied to the battery. Additionally, the charging device 416 may be capable of varying the charging rate based at least in part on the battery charging settings 410.

As illustrated in FIG. 4, the battery charging device 400 may include a diagnostic device 418. Further, the diagnostic device 418 may generate health reports, such as health report 324. In some examples, the diagnostic device may be capable of measuring the voltage, capacity, and/or internal resistance of a battery coupled to the battery charging device. For instance, the diagnostic device 418 may include a voltmeter, multi-meter, and/or other sensors. Additionally, the battery charging device 400 may include a temperature sensor(s) 420 (e.g., thermocouple, thermal imaging device, etc) for determining a temperature of a battery during a charging operation. As described above, a health report and/or a charging log may include a temperature determined by the temperature sensor(s) 420. In addition, the battery charging device 400 may suspend a charging process based at least in part on the temperature sensor(s) 420 determining that the temperature of the battery is currently above a predetermined threshold. Further, the battery charging device 400 may display a message indicating that the likelihood of the battery failing is above a predefined threshold based on the temperature sensor(s) 420 determining that the temperature of the battery is currently above a predetermined threshold Further, the diagnostic device 418 may be able to determine a physical condition of a battery. For instance, the diagnostic device 418 may be able to receive information from an accelerometer coupled to a battery. In some other instances, the diagnostic device 418 may be able to inspect a battery for physical damage. Upon the detection of physical damage, the battery charging device 400 may include information associated with the physical damage in a health report, such as health report 324, for the battery. For instance, the diagnostic device 418 may include accelerometer information describing a drop of a battery in a health report associated with the battery. Further, the battery charging device 400 may display a message indicating that the likelihood of the battery failing is above a predefined threshold based on the diagnostic device 418 detecting the presence of physical damage to the battery above a predefined threshold. In some examples, the battery management service 102 may provide the predefined threshold for physical damage. For instance, the diagnostic device may measure a physical attribute of the battery, and compare the measured value to an expected value of the physical attributed received from the battery management service 102. Additionally, or alternatively, the battery charging device 400 may display a message indicating that battery failing is above a predefined threshold based at least in part on communication, such as the failure message 326, from the battery management service 102.

As illustrated in FIG. 4, the battery charging device 400 may further be equipped with various input/output (I/O) devices 422 and a display 424. Such I/O devices 422 may include various user interface controls (e.g., buttons, joystick, keyboard, mouse, touch screen, etc.), audio speakers, connection ports and so forth. Additionally, the battery charging device 400 may include a power source 424.

FIG. 5 illustrates an example flow diagram of a process for automatically preparing a rechargeable battery for a UAV flight according to some implementations.

At 502, the battery management service may determine an upcoming flight path from an origin location to a destination location, the flight path being assigned to the UAV. For instance, as discussed with respect to FIG. 2, the scheduling module 214 may assign delivery of the delivery package 204 to the UAV 202. Further, the scheduling module 214 may determine the flight path 208 between the origination location 206 and the destination location 210. In some examples, the scheduling module 214 may determine the flight path 208 based on previous flights with related flight characteristics. Additionally, or alternatively, the scheduling module 214 may determine the flight path 208 based on anticipated flight characteristics. For instance, the scheduling module 214 may determine the flight path 208 based on flight conditions in the vicinity of the origination location and/or the destination location.

At 504, the battery management service may determine an optimal charge level for the rechargeable battery based at least in part on the flight path and the UAV prediction model. For instance, the management module 116 may determine a charge level needed for the battery to power the UAV for the flight path based at least in part on the UAV model 310. Further, the UAV model 310 may account for the distance of the flight path, environmental conditions along the flight path, and/or one or more dimensions of the UAV. The management module 116 may determine an optimal charge level 220 for the UAV based at least in part on the predicted amount of energy and a reserve capacity. In some examples, the reserve capacity may equal a pre-defined percentage of the predicted amount of energy (e.g., 10% of the predicted amount). In some other examples, the reserve capacity may equal an amount of energy needed to travel for a predetermined period time (e.g., an amount of energy needed by the UAV to travel an additional forty-five minutes).

At 506, the battery management service may assign the rechargeable battery to power the UAV to complete the flight path. For instance, as discussed above with respect FIG. 2, the assignment module 218 may assign the battery 212 to the UAV 202. In some cases, the assignment module 218 may assign the battery 212 to the UAV 202 based at least in part on the battery status information 216 and/or the charge level 220.

For example, the assignment module 218 may determine that the battery 212 is compatible with the UAV 202. In another example, the assignment module 218 may assign the battery 212 to the UAV 202 based at least in part on the battery status information 216 indicating that the probability of the battery 212 failing is below a predetermined threshold. Additionally, or alternatively, the assignment module 218 may assign the battery 212 to the UAV 202 based at least in part on determining that the capacity of the battery 212 is sufficient to permit the UAV 202 to complete the flight path.

At 508, the battery management service may determine, using the identifier, a charging time, a charging current, and a charging voltage for the rechargeable battery based at least in part on the battery charging settings. For instance, as described in FIG. 1, the management module 116 may determine battery charging settings 118 associated with the battery 106 based at least in part on the battery identifier 110.

At 510, the battery management service may send, via the communication interface, the optimal charge level, the charging time, the charging current, and the charging voltage to a battery charging device coupled to the rechargeable battery. For instance, the management module may send charging instructions 222 to the battery charging device 104. Further, the charging instructions 222 may include the battery charging settings 118 and the charge level 220.

Figure 6:
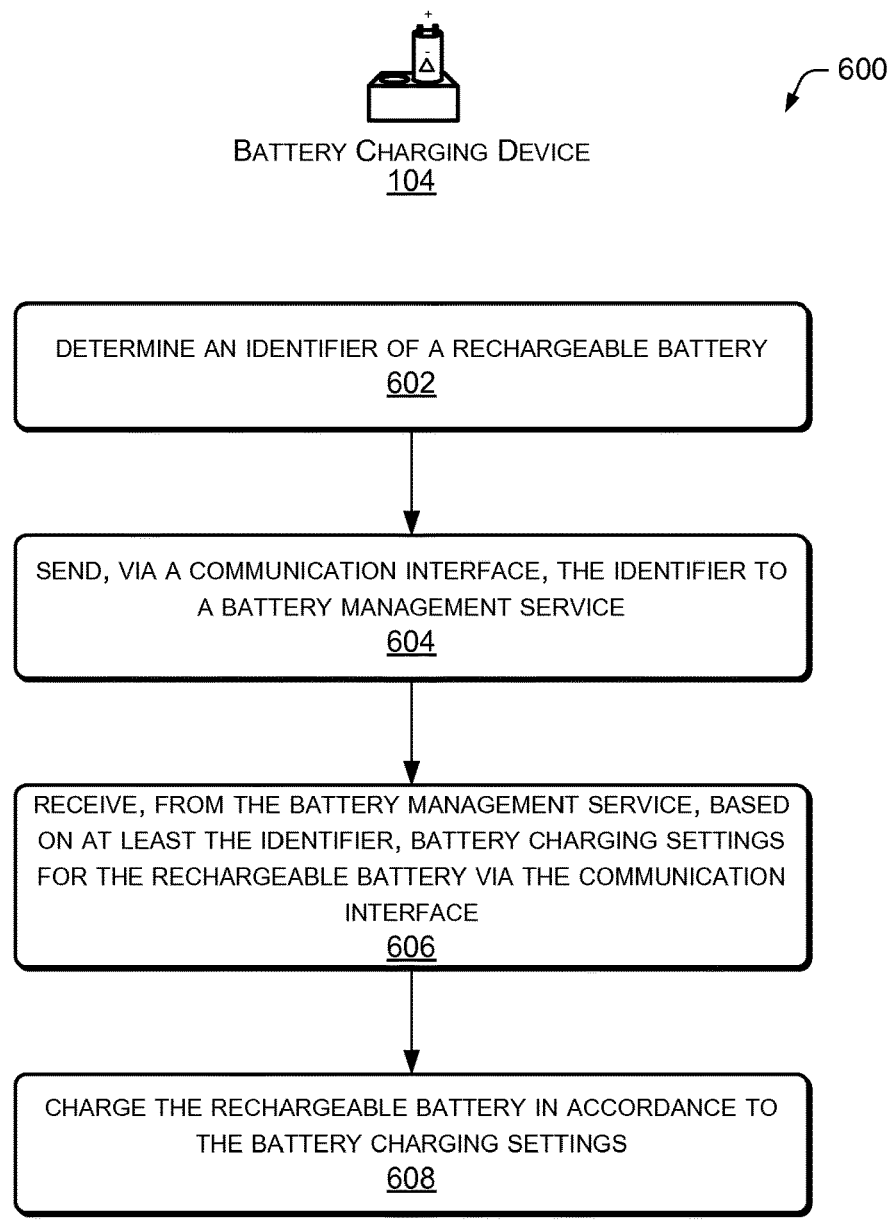
FIG. 6 illustrates is an example flow diagram of a process for automatically preparing a rechargeable battery for a UAV flight according to some implementations.

FIG. 6 illustrates an example flow diagram of a process for automatically charging a battery according to some implementations.

At 602, the battery charging device may determine an identifier of a rechargeable battery. For instance, the identification reader 414 of the battery charging device 400 may identify a battery identifier, such as battery identifier 110, of a battery, such as battery 106. In some cases, the identification reader 414 may employ a scanner/reader, a visual recognition device, or an OCR device to determine an identifier of a battery At 604, the battery charging device may send, via a communication interface, the identifier to a battery management service. For instance, as discussed above with respect FIG. 1, the battery charging device 104 may send the settings request 112 to the battery management service 102. Further, as illustrated in FIG. 1, the settings request 112 may include the battery identifier 110.

At 606, the battery charging device may receive, from the battery management service, based on at least the identifier, battery charging settings for the rechargeable battery via the communication interface. For instance, as discussed above with respect FIG. 1, the battery charging device 104 may receive the settings response 120 from the battery management service 102. Further, as illustrated in FIG. 1, the settings response 120 may include the battery charging settings 118.

At 608, the battery charging device may charge the rechargeable battery in accordance with the battery charging settings. For instance, as discussed above with respect FIG. 4, the battery charging device 400 may configure the charging device 416 according to the charging settings, such as battery charging settings 118, and charge the battery using the charging device 416.

In some cases, the battery charging device may further monitor the charging process. Further, the battery charging device 400 may suspend the charging process to prevent damage to a battery and/or a potentially hazardous event. For instance, the battery charging device 400 may suspend the charging process if the temperature sensor(s) detects that temperature of a charging battery is above a predetermined threshold. In another instance, the battery charging device 400 may suspend the charging process if one or more events during the charging process indicate that the charging settings do not correspond to a type of the battery. Further, the battery charging device 400 may utilize the diagnostic device 418 and temperature sensor(s) 420 to detect the one or more events.

Figure 7:
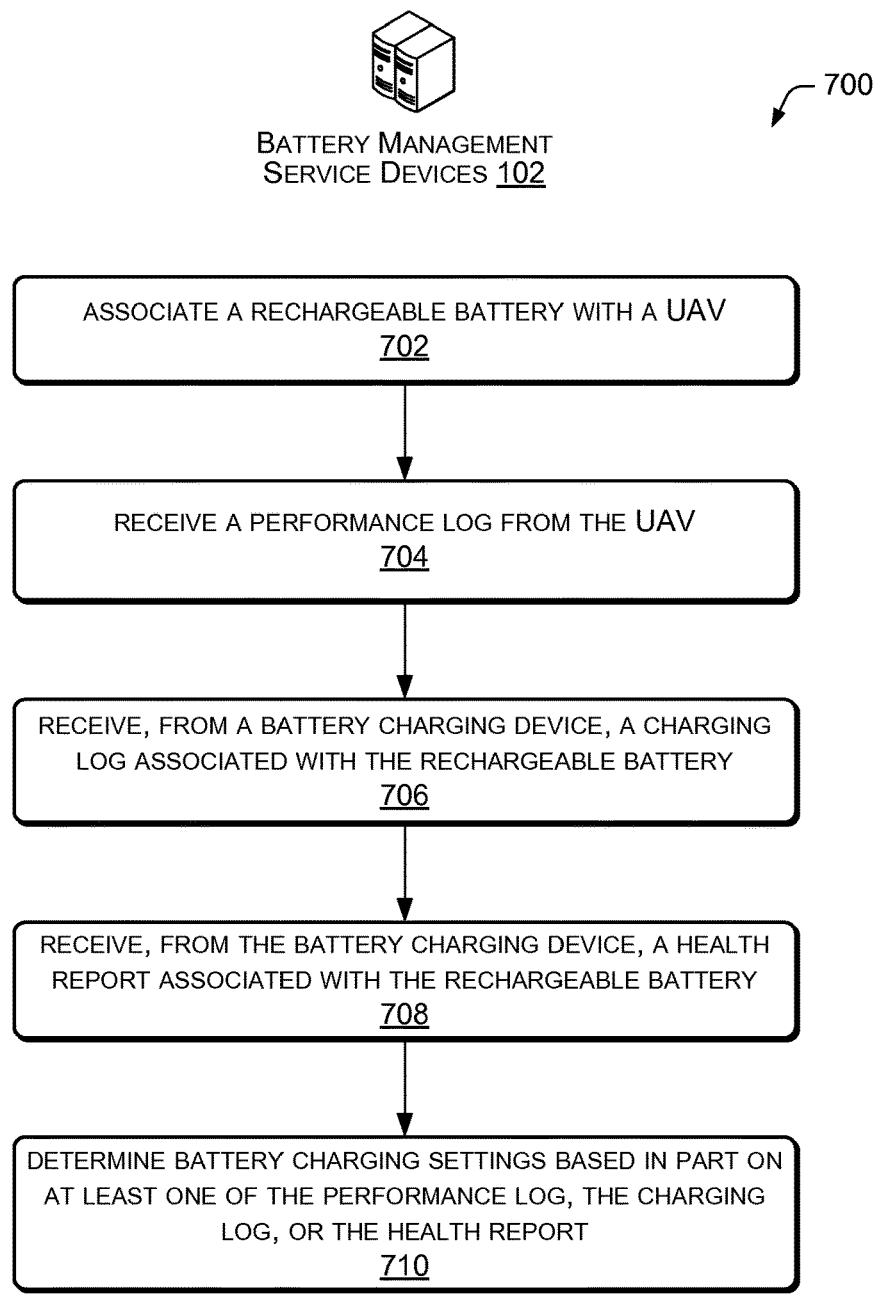
FIG. 7 illustrates is an example flow diagram of a process for determining optimal battery charging settings for a rechargeable battery according to some implementations.

FIG. 7 illustrates is an example flow diagram of a process for determining optimal battery charging settings for a rechargeable battery according to some implementations.

At 702, the battery management service may associate a rechargeable battery with a UAV, the rechargeable battery used by the UAV to travel a plurality of flight paths during a testing phase. For instance, the battery management service 102 may assign the battery 110 to the UAV 108 during a testing phase. Further, the UAV 108 may fly a plurality of flight paths using the battery 110 during the test phase. In some cases, the battery management service may determine battery charging settings, such as battery charging settings 118, during a testing phase. In some other cases, the battery management service 102 may determine whether the battery 110 can be used with the UAV 108 during a testing phase.

At 704, the battery management service may receive, from the UAV, a performance log, the performance log including performance data for the plurality of flight paths traveled by the UAV the battery charging device may send, via a communication interface, the identifier to a battery management service. For instance, as discussed above with respect FIG. 3, the UAVs 302 may send the performance logs 318 to the battery management service 102 over the network 114. Further, the performance log 318 may identify the UAV 108 and an actual load discharged by the battery 110 during the UAV 108 activity described in the performance log 318. Some factors responsible for the actual load discharged by the battery 110 may include sensor activity during the UAV 108 activity described in the performance log 318, environmental conditions in the flight paths travelled by the UAV, and/or delivery package characteristics (e.g., size, weight, etc.), flight characteristics (flight path distance, altitude, etc.).

At 706, battery management service may receive, from a battery charging device, a charging log associated with the rechargeable battery, the charging log specifying the current and voltage used to charge the rechargeable battery at a plurality of instances within the testing phase. For instance, as discussed above with respect FIG. 3, the battery charging device 104 may send charging logs 320 to the battery management service device 102 over the network 114. As described above, an entry in the battery log 320 may include an identifier of the corresponding battery 322, an initial charge level of the corresponding battery 322, a final charge level of the corresponding battery 322, one or more temperature values detected during the charging of the corresponding battery 322, a total amount of the charging time, an amount of current input into the corresponding battery 322, a voltage used to charge the rechargeable battery 322, a value indicating whether the charging process was successful, and/or other information. Further, the battery log may include multiple entries with each individual entry corresponding to an attempt to charge the battery 322.

At 708, battery management service may receive, from the battery charging device, a health report associated with the rechargeable battery, the health report specifying the internal resistance and capacity of the rechargeable battery within the testing phase. For instance, the battery charging device 104 may send the battery health report 324 to the battery management service 102. The health report 324 may include the internal resistance of the battery 322 and the capacity of the battery 322.

At 708, battery management service may determine recommended battery charging settings based in part on at least one of the performance log, the charging log, or the health report. For instance, the management module may employ testing techniques to determine battery charge settings, such as battery charging settings 118, which prolong the life of a battery and/or maximize performance of the battery based at least in part on the performance log, the charging logs 320, and the health reports 324. For example, the management module may determine a current value and a voltage value for charging a battery based at least in part on the charging log and health report indicating that charging the battery with the current value and the voltage value extended the life of the battery.

Additionally, or alternatively, the management module may generate a battery prediction model, such as battery models 312, for predicting future performance of a rechargeable battery based in part on at least one of the charging log or health report. Further, the management module may generate a UAV prediction model, such as UAV models 310, for predicting the amount of energy needed to perform activity by the UAV based at least in part on the performance log, the charging logs 320, and the health reports 324.

Although the subject matter has been described in language specific to structural features and/or methodological acts, it is to be understood that the subject matter defined in the appended claims is not necessarily limited to the specific features or acts described. Rather, the specific features and acts are disclosed as illustrative forms of implementing the claims.

What is claimed is:

1. One or more non-transitory computer-readable media maintaining instructions that, when executed by one or more processors, cause the one or more processors to perform operations comprising:

associating a rechargeable battery with an unmanned aerial vehicle (UAV), the rechargeable battery used by the UAV to travel a plurality of flight paths during a testing phase;

receiving, from the UAV, a performance log, the performance log including performance data of the UAV for the plurality of flight paths traveled by the UAV and a flight path characteristic for at least one flight path of the plurality of flight paths;

receiving, from a battery charging device, a charging log associated with the rechargeable battery, the charging log specifying a current and a voltage used to charge the rechargeable battery at a plurality of instances within the testing phase;

receiving, from the battery charging device, a health report associated with the rechargeable battery, the health report specifying an internal resistance and a capacity of the rechargeable battery within the testing phase;

determining recommended battery charging settings based in part on at least one of the performance log, the charging log, or the health report, wherein the recommended battery charging settings comprise at least one of a charge time, a charge current, or a charge voltage;

sending, to the battery charging device, the recommended battery charging settings; and causing the rechargeable battery to be charged based at least in part on the recommended battery charging settings.

2. The one or more non-transitory computer-readable media as recited in claim 1, wherein the operations further comprise:

identifying a type of the rechargeable battery as a recommended type of battery for the UAV based at least in part on at least one of the performance log, the charging log, or the health report.

3. The one or more non-transitory computer-readable media as recited in claim 2, wherein the rechargeable battery represents a first rechargeable battery, the performance log represents a first performance log, the charging log represents a first charging log, and the health report represents a first health report, and wherein identification of the type of the rechargeable battery as the recommended type of battery for the UAV based at least in part on at least one of the first performance log, the first charging log, or the first health report, and wherein the operations further comprise:
   comparing at least one of the first performance log, the first charging log, or the first health report with at least one of a second performance log, a second charging log, or a second health report, the second performance log, the second charging log, and the second health report being associated with a second rechargeable battery of a different type than the first rechargeable battery.

4. The one or more non-transitory computer-readable media as recited in claim 1, wherein the rechargeable battery represents a first rechargeable battery, and the operations further comprise:
   generating a battery prediction model for predicting future performance of the rechargeable battery based in part on at least one of the charging log or the health report; and
   determining that a second rechargeable battery has a likelihood of failing above a predetermined threshold based at least in part on the battery prediction model.

5. The one or more non-transitory computer-readable media as recited in claim 1, wherein the rechargeable battery represents a first rechargeable battery, the flight path represents a first flight path, and the operations further comprise:
   generating a UAV prediction model for determining an amount of energy estimated to perform an activity by the UAV based at least in part on the performance log; and
   predicting an amount of energy needed for the UAV to travel a second flight path based at least in part on the UAV prediction model.

6. The one or more non-transitory computer-readable media as recited in claim 1, wherein sending, to the battery charging device, the recommended battery settings is via a communication interface, wherein the rechargeable battery represents a first rechargeable battery, and the operations further comprise:
   receiving, via the communication interface, an identifier of a second rechargeable battery of a same type as the first rechargeable battery.

7. A device comprising:
one or more processors; and
one or more non-transitory computer-readable media storing instructions executable by the one or more processors, wherein the instructions program the one or more processors to implement a service to:
   associate a rechargeable battery with an unmanned aerial vehicle (UAV), the rechargeable battery used by the UAV to travel a plurality of flight paths during a testing phase;
   receive, from the UAV, a performance log, the performance log including performance data of the UAV for the plurality of flight paths traveled by the UAV and a flight path characteristic for at least one flight path of the plurality of flight paths;
   receive, from a battery charging device, a charging log associated with the rechargeable battery, the charging log specifying a current and a voltage used to charge the rechargeable battery at a plurality of instances within the testing phase;
   receive, from the battery charging device, a health report associated with the rechargeable battery, the health report specifying an internal resistance and a capacity of the rechargeable battery within the testing phase;
   determine battery charging settings based in part on at least one of the performance log, the charging log, or the health report, wherein the battery charge settings comprise at least one of a charge time, a charge current, or a charge voltage;
   send, to the battery charging device, the battery charging settings; and
   charging the rechargeable battery based in part on at least the battery charging settings.

8. The device of claim 7, wherein the instructions further program the one or more processors to:
   identify a type of the rechargeable battery as a recommended type of battery for the UAV based at least in part on at least one of the performance log, the charging log, or the health report.

9. The device of claim 7, wherein the charging log further comprises at least one of a current value input into the rechargeable battery or a temperature detected during a recharging process of the rechargeable battery.

10. The device of claim 7, wherein the instructions further program the one or more processors to:
   generate a battery prediction model for predicting future performance of the rechargeable battery based in part on at least one of the charging log or the health report; and
   determine that a second rechargeable battery has a likelihood of failing above a predetermined threshold based at least in part on the battery prediction model.

11. The device of claim 7, wherein the instructions further program the one or more processors to:
   determine an upcoming flight path from an origin location to a destination location, the flight path being assigned to the UAV; and
   determine an optimal charge level for the rechargeable battery based at least in part on the flight path and a UAV prediction model.

12. The device of claim 11, wherein the instructions further program the one or more processors to:
   determine an optimal charge level by determining expected flight characteristics associated with the flight path, the flight characteristics including at least one of a distance of the flight, a weather condition associated with the flight path, one or more attributes of a package to be delivered by the UAV to the destination location, or a UAV sensor activity.

13. A method comprising:
associating a rechargeable battery with an unmanned aerial vehicle (UAV), the rechargeable battery used by the UAV to travel a plurality of flight paths during a testing phase wherein the rechargeable battery includes an identifier;
receiving, from the UAV, a performance log, the performance log including performance data of the UAV for the plurality of flight paths traveled by the UAV and a flight path characteristic for at least one flight path of the plurality of flight paths;
receiving, from a battery charging device, a charging log associated with the rechargeable battery, the charging log specifying a current and a voltage used to charge the rechargeable battery at a plurality of instances within the testing phase;
receiving, from the battery charging device, a health report associated with the rechargeable battery, the health report specifying an internal resistance and a capacity of the rechargeable battery within the testing phase;

determining battery charging settings based in part on at least one of the performance log, the charging log, or the health report, wherein the battery charge settings comprise at least one of a charge time, a charge current, or a charge voltage;

sending, to the battery charging device, the battery charging settings; and charging the rechargeable battery based in part on at least the battery charging settings.

14. The method of claim 13, wherein the identifier is at least one of a bar code, 2D/3D bar code, Quick Response (QR) code, Near Field Communication (NFC) tag, Radio Frequency Identifier Device (RFID) tag, magnetic stripe, Universal Product Code (UPC), Stock-Keeping Unit (SKU), serial number, a unique physical shape, a unique physical feature, or a proprietary designation.

15. The method of claim 13, further comprising: determining the identifier of the rechargeable battery.

16. The method of claim 15, wherein determining the identifier of the rechargeable battery is performed by at least one of an optical character recognition device or a physical recognition device.

17. The method of claim 13, wherein determining the battery charging settings is further based in part on the identifier.

18. The method of claim 13, wherein the rechargeable battery represents a first rechargeable battery, the performance log represents a first performance log, the charging log represents a first charging log, and the health report represents a first health report, and wherein identification of the rechargeable battery as a recommended type of battery for the UAV is based at least in part on at least one of the first performance log, the first charging log, or the first health report, further comprising:

comparing at least one of the first performance log, the first charging log, or the first health report with at least one of a second performance log, a second charging log, or a second health report, the second performance log, the second charging log, and the second health report being associated with a second rechargeable battery of a different type than the first rechargeable battery.

19. The method of claim 13, wherein the battery charging settings further comprise a temperature value, and further comprising:

determining, via a temperature sensor, that a temperature of the rechargeable battery is within a predetermined threshold range from the temperature value; and displaying a message that a probability of failure of the rechargeable battery is above a threshold amount.

20. The method of claim 13, wherein the battery charge settings further comprise a charge level, and wherein charging the rechargeable battery comprises charging the rechargeable battery to the charge level.

* * * * *